(12) United States Patent
Wang et al.

(10) Patent No.: US 11,795,538 B2
(45) Date of Patent: Oct. 24, 2023

(54) NANO COMPOSITE COATING HAVING SHELL-SIMULATED MULTI-ARCH STRUCTURE AS WELL AS PREPARATION METHOD AND APPLICATION THEREOF

(71) Applicant: NINGBO INSTITUTE OF MATERIALS TECHNOLOGY & ENGINEERING, CHINESE ACADEMY OF SCIENCES, Ningbo (CN)

(72) Inventors: Liping Wang, Ningbo (CN); Minpeng Dong, Ningbo (CN); Jinlong Li, Ningbo (CN)

(73) Assignee: NINGBO INSTITUTE OF MATERIALS TECHNOLOGY & ENGINEERING, CHINESE ACADEMY OF SCIENCES, Ningbo (CN)

( * ) Notice: Subject to any disclaimer, the term of this patent is extended or adjusted under 35 U.S.C. 154(b) by 190 days.

(21) Appl. No.: 17/312,939

(22) PCT Filed: Jul. 13, 2020

(86) PCT No.: PCT/CN2020/101632
§ 371 (c)(1),
(2) Date: Jun. 11, 2021

(87) PCT Pub. No.: WO2022/011501
PCT Pub. Date: Jan. 20, 2022

(65) Prior Publication Data
US 2022/0364220 A1 Nov. 17, 2022

(51) Int. Cl.
*C23C 14/14* (2006.01)
*B82Y 30/00* (2011.01)
(Continued)

(52) U.S. Cl.
CPC ............ *C23C 14/14* (2013.01); *C23C 14/021* (2013.01); *C23C 14/025* (2013.01); *C23C 14/04* (2013.01);
(Continued)

(58) Field of Classification Search
None
See application file for complete search history.

(56) References Cited

U.S. PATENT DOCUMENTS 6,365,491 B1 * 4/2002 Martin .............. H01L 21/02422
438/479
2004/0175633 A1 * 9/2004 Shoki ................. C03C 17/3665
428/428

(Continued)

FOREIGN PATENT DOCUMENTS

CN 102580154 A * 7/2012
CN 111334778 A * 6/2020

*Primary Examiner* — Seth Dumbris
(74) *Attorney, Agent, or Firm* — Bayramoglu Law Offices LLC

(57) ABSTRACT

The preparation method for a nano composite coating having a shell-simulated multi-arch structure includes: constructing a discontinuous metal seed layer using a vacuum plating technology; and inducing the deposition of a continuous multi-arch structure layer utilizing the discontinuous metal seed layer, thereby realizing the controllable orientated growth of the nano composite coating having the shell-simulated multi-arch structure. The nano composite coating having the shell-simulated multi-arch structure is of a red abalone shell-simulated nacreous layer aragonite structure, meanwhile has high hardness and high temperature resistance, has excellent performances such as high breaking strength, low friction coefficient and corrosion and abrasion resistance in seawater under the condition of maintaining good breaking tenacity, is simple and controllable in preparation process and low in cost, has unlimited workpiece (Continued)

shapes, is easily produced on large scale, and has huge potential in the fields of new energy, efficiency power, ocean engineering, nuclear energy, and micro-electronic/optoelectronic devices.

16 Claims, 4 Drawing Sheets

(51) Int. Cl.
- *C23C 14/02* (2006.01)
- *C23C 14/34* (2006.01)
- *C23C 14/04* (2006.01)
- *C23C 14/06* (2006.01)

(52) U.S. Cl.
CPC .......... *C23C 14/0664* (2013.01); *C23C 14/34* (2013.01); *B82Y 30/00* (2013.01); *Y10T 428/24917* (2015.01)

(56) References Cited

U.S. PATENT DOCUMENTS

| | | | |
|---|---|---|---|
| 2010/0104833 A1* | 4/2010 | Li | C09D 5/28 427/404 |
| 2010/0164364 A1* | 7/2010 | Eida | H10K 50/125 313/499 |

\* cited by examiner

NANO COMPOSITE COATING HAVING SHELL-SIMULATED MULTI-ARCH STRUCTURE AS WELL AS PREPARATION METHOD AND APPLICATION THEREOF

CROSS REFERENCE TO THE RELATED APPLICATIONS

This application is the national phase entry of International Application No. PCT/CN2020/101632, filed on Jul. 13, 2020, the entire contents of which are incorporated herein by reference.

TECHNICAL FIELD

The present application relates to an abrasion-resistant corrosion-resistant coating, particularly to a nano composite coating having a shell-simulated multi-arch structure, a method for inducing the construction of the nano composite coating based on a metal seed layer and application thereof, belonging to the technical field of surface protection.

BACKGROUND

With the needs of human development related to climate change, low-carbon world, energy and security and green intelligent manufacturing, it is urgent to concern the key fracture and damage mechanics problems in the fields of new energy, high-efficiency power, large aircraft, new aerospace vehicles, advanced manufacturing, high-speed rail traffic, ocean engineering, nuclear power facilities, microelectronics/optoelectronic devices and the like that have major demands. In this context, the working environment of mechanical parts in various equipment is becoming more and more harsh, so high hardness, high strength, high toughness, high temperature resistance, wear resistance and corrosion resistance requirements of parts are becoming higher and higher. Abrasion and fracture are common failure forms of mechanical parts. Therefore, improvement of surface hardness, breaking strength and tenacity as well as and abrasion in special environment of parts. In addition, the biological fouling of some marine engineering equipment has been restricting the development of marine industry, so it is necessary to take effects of sterilization and antifouling by utilizing the release of soft metals on marine equipment.

At present, some researchers have proposed a solution that a bionic structure coating is covered on the above mechanical parts to solve the above problems, but the performances of these bionic structure coatings are not ideal. It is generally believed that the preparation of a multifunctional integrated bionic coating with an obvious biological structure under the current environmental conditions is challenging.

The applicant has proposed a nano composite coating having a shell-simulated stacking type nacreous layer, which comprises a hard nano metal composite phase and a soft metal phase. The soft metal phase is evenly layered and distributed in the hard nano metal composite phase. The nano composite coating exhibits good hardness, friction coefficient, corrosion resistance and wear resistance in seawater. However, in order to achieve multi-functional integration (hardness, strength, toughness, corrosion resistance, etc.) to better meet the application demands of key breaking, thermal resistance and abrasion resistance in the fields of new energy, high-efficiency power, large aircraft, new aerospace vehicles, advanced manufacturing, high-speed rail traffic, ocean engineering, nuclear power facilities, microelectronics/optoelectronic devices and the like that have major demands, the performances need to be further improved.

SUMMARY

The main objective of the present application is to provide a nano composite coating having a shell-simulated multi-arch structure to overcome the defects in the prior art.

The another objective of the present application is to provide a method for inducing construction of a nano composite coating having a shell-simulated multi-arch structure based on a metal seed layer.

The another objective of the present application is to provide use of the nano composite coating having the shell-simulated multi-arch structure.

In order to realize the above objectives, the technical solution provided by the present application is as follows:

The embodiments of the present application provide a nano composite coating having a shell-simulated multi-arch structure, comprising a discontinuous metal seed layer and a continuous multi-arch structure layer, wherein the discontinuous metal seed layer comprises a plurality of metal island-shaped seeds discretely distributed on the surface of a substrate; the multi-arch structure layer comprises a plurality of arched structure units respectively deposited on the plurality of metal island-shaped seeds, each arched structure unit comprising one or more arched hard nano ceramic phase layers and one or more arched soft metal phase layers which are alternately deposited on the corresponding metal island-shaped seeds.

The embodiments of the present application also provide a method for inducing preparation of a nano composite coating having a shell-simulated multi-arch structure based on a metal seed layer, comprising:

forming a discontinuous metal seed layer on the surface of a substrate, the discontinuous metal seed layer comprising a plurality of metal island-shaped seeds discretely distributed on the surface of the substrate; and with the surfaces of various metal island-shaped seeds in the discontinuous metal seed layer as growth templates, alternately depositing one or more arched hard nano ceramic phase layers and one or more arched soft metal phase layers on the various metal island-shaped seeds, performing orientated growth to form arched structure units, furthermore, mutually connecting the plurality of arched structure units, thereby forming a continuous multi-arch structure layer on the discontinuous metal seed layer.

In some embodiments, the method comprises: successively depositing the discontinuous metal seed layers and the multi-arch structure layers on the substrate using a physical vapor deposition technology, thereby obtaining the nano composite coating.

In some embodiments, the method specifically comprises:

Step 1, depositing the discontinuous metal seed layer on the substrate subjected to pretreatment and ion etching using the soft metal target material, wherein the adopted working gas is a high-pure inert gas;

Step 2, alternately depositing the hard nano ceramic phase layers and the soft metal phase layers on the substrate using the multi-element metal target material and the soft metal target material, thereby forming the multi-arch structure layer, wherein the adopted working gas comprises a high-pure inert gas, high-pure nitrogen and a hydrocarbon gas.

The embodiments of the present application also provide use of the nano composite coating having a shell-simulated multi-arch structure in new energy, high efficiency power, large aircraft, new aerospace vehicles, advanced manufacturing, high-speed rail transit, ocean engineering, nuclear power facilities, microelectronics/optoelectronic devices and other fields.

Compared with the prior art, the above technical solution provided by the embodiments of the present application has the advantages:

1) the provided nano composite coating having a shell-simulated multi-arch structure is of a red abalone shell-simulated nacreous layer aragonite structure and meanwhile has high hardness and high temperature resistance, has excellent performances such as high breaking strength, low friction coefficient and corrosion and abrasion resistance in seawater under the condition of maintaining good breaking tenacity, and has huge potential in the aspects of breakage, heat resistance and abrasion resistance applications;

2) the provided nano composite coating having a shell-simulated multi-arch structure is simple and controllable and low in cost, has unlimited workpiece shapes, and is easily produced on large scale.

BRIEF DESCRIPTION OF THE DRAWINGS

For more clearly explaining the technical solution in embodiments of the present application or in the prior art, the drawings used in the embodiments or in the prior art will be simply described, obviously, the drawings described below are only some embodiments in the present application, for persons of ordinary skill in the art, other drawings are obtained according to these drawings without creative efforts.

DETAILED DESCRIPTION OF THE EMBODIMENTS

Figure 1A:
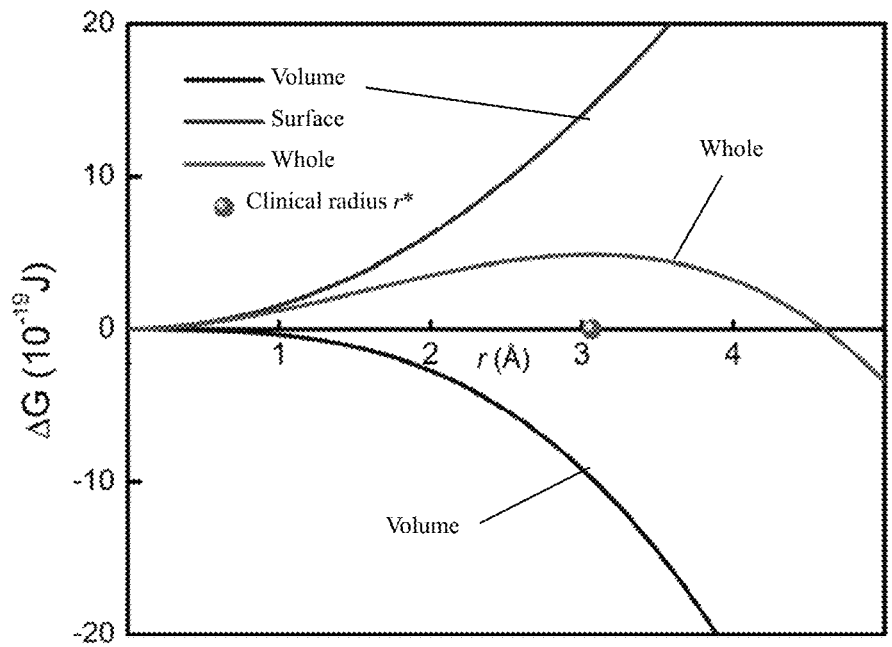
FIG. 1A shows a simulated calculation result of Ag free energy change in the process of vapor phase deposition in an embodiment of the present application.

As described above, in view of the defects in the prior art, the inventor of this case acquires the technical solution of the present application through long-term research and lots of practices. The technical solution mainly proposes a nano composite coating having a shell-simulated multi-arch structure which completely simulates a multi-arch aragonite nacreous layer of red abalone and a preparation method thereof. Next, the technical solution of the present application will be explained and described in detail.

One aspect of the embodiment of the present application provides a nano composite coating having a shell-simulated multi-arch structure, comprising a discontinuous metal seed layer and a continuous multi-arch structure layer, wherein the discontinuous metal seed layer comprises a plurality of metal island-shaped seeds discretely distributed on the surface of a substrate; the multi-arch structure layer comprises a plurality of arched structure units respectively deposited on the plurality of metal island-shaped seeds, each arched structure unit comprising one or more arched hard nano ceramic phase layers and one or more arched soft metal phase layers which are alternately deposited on the corresponding metal island-shaped seeds.

Further, each arched structure unit is deposited using a corresponding metal island-shaped seed as a template.

In some embodiments, the metal island-shaped seed is of an ellipse shape and has a thickness of 20-40 nm and a diameter of 50-100 nm, and a distance between adjacent metal island-shaped seeds is 30-60 nm.

In some embodiments, the plurality of arched structure units are successively connected in a direction parallel to the surface of the substrate (also considered as a direction of extending along the surface of the substrate, thereby forming a continuous layered structure, namely, the multi-arch structure layer.

In some embodiments, the hard nano ceramic phase layer and the soft metal phase layer in the arched structure unit both have nano-scale thickness. For example, the thicknesses of the hard nano ceramic phase layer and the soft metal phase layer are both 5-20 nm.

In some embodiments, the outermost layer of the composite coating is the hard nano ceramic phase layer.

Wherein, the hard nano ceramic phase layers and the soft metal phase players are alternately deposited, soft metal particles are obstructed by the ceramic phase layer through regulation of the thicknesses, alternating periods and other parameters of the hard nano ceramic phase layer and the soft metal phase player, and then the precise distribution regulation and trace controllable release of soft metal particles in the nano composite coating are achieved.

In some embodiments, each arched structure unit is formed via orientated growth by using the surface of a corresponding metal island-shaped seed as a growth template.

In some embodiments, the material of the discontinuous metal seed layer or the soft metal phase layer comprises Ag, Cu or Al, but is not limited thereto.

In some embodiments, the doping content of the soft metal element in the composite coating is controlled between 15 at. % and 18 at. %, and the soft metal element comprises Ag, Cu or Al.

The nano composite coating having a shell-simulated multi-arch structure provided by the above embodiment of the present application is of a red abalone shell-simulated nacre layer aragonite arched structure, in which both of a hard ceramic enhanced phase and a soft metal energy dissipation phase exhibit arched structure alternating deposition having obvious mechanical advantages, so that they have excellent breaking strength (15 GPa or more) and keep high breaking tenacity (~2 MPa·m$^{1/2}$), and meanwhile have the hardness of 30 GPa or more (preferably, 35 GPa or more), and have the abrasion rate of $10^{-7}$ mm$^3$/Nm order of magnitudes. Further, the thickness of the composite coating can be regulated according to actual application demands, for example preferably 2-5 μm.

Another aspect of the embodiment of the present application also provides a preparation method of a nano composite coating having a shell-simulated multi-arch structure. The method can be defined as a "one-step" preparation method, which induces the controllable orientated deposition of the nano composite coating having a shell-simulated multi-arch structure by using a vacuum plating technology through construction of the metal seed layer.

Further, the preparation method comprises: the growth process of the metal seed layer is simulated based on the minimum surface Gibbs free energy theory and dynamic numerical value of the first principle to guide the growth of the metal seed layer and build a multi-arch structure. Wherein, in the multi-arch structure, the soft metal phases and the hard nano ceramic phases are deposited regularly and alternately on a nano scale, so as to achieve controllable orientated deposition during the entire deposition process of the coating.

Further, the preparation method comprises:

Based on the Gibbs-Thomson effect and Ostwald theory, the soft metal is used to achieve the controllable deposition of the discontinuous metal seed layer, which can be analogous to the spherulitic calcite structure in nacre; and Based on the Gibbs-Thomson effect and Ostwald theory, the soft metal and hard nano ceramic phases are deposited regularly and alternately on the discontinuous metal seed layer on nano scale, which can be completely analogous to the soft energy dissipation phase and hard enhancement phase.

Figure 1B:
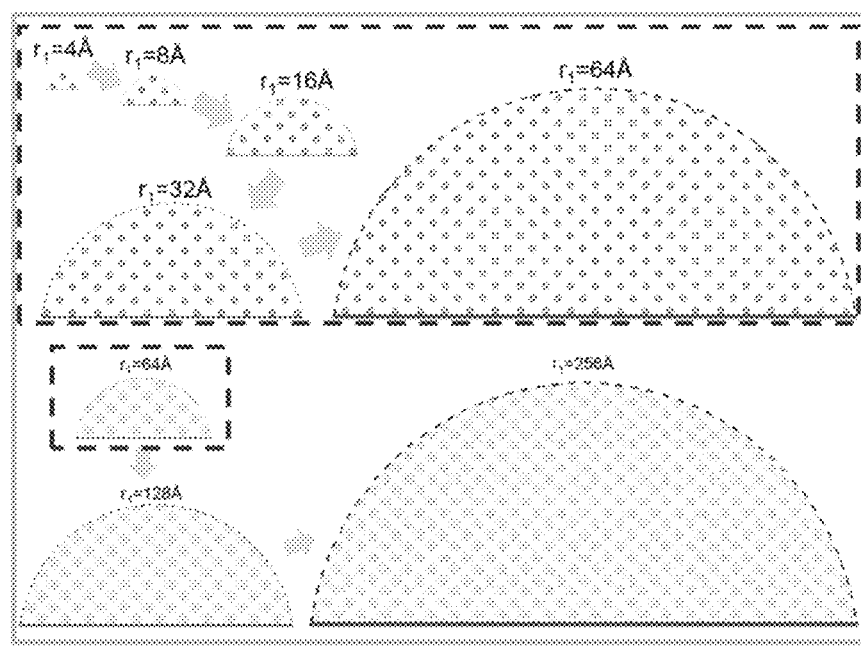
FIG. 1B shows a typical growth process (two-dimensional section) of an island-shaped soft metal Ag seed layer in an embodiment of the present application.

More further, the preparation method comprises:

the critical nucleation radius of metal island seed is calculated using the first principle of the classical nucleation formula, and the growth rate of the metal island seed is analyzed through Ostwald maturation theory kinetic simulation;

data is calculated based on the nucleation and growth kinetics of the metal island seed for guidance (the growth of Ag island seeds is taken as an example, the simulation results are shown in FIG. 1A and FIG. 1B), and parameters such as deposition temperature and time are controlled through regulation of metal deposition ion energy and flux to prepare a discontinuous metal seed layer organized by nano-scale metal island seeds;

the MeCN hard phase layers (namely, the above hard nano ceramic phase layer) and the metal soft phase layers are alternately deposited on the discontinuous metal seed layer, the orientated growth of the subsequent alternately deposited coatings is induced and defined as a multi-arch structure using the curve surface of the metal island-shaped seed surface as a template in combination with the deposition parameter of the coating, so as to realize the controllable preparation of the nano composite coating having a shell-simulated multi-arch structure.

More further, the growth mechanism is as follows (metallic Ag is taken as an example, it can also be Cu or Al): the critical nucleation radius of Ag is calculated using the first principle of the classical nucleation formula, and the growth rate of Ag is analyzed through Ostwald ripening theory kinetic simulation. Based on the guidance of Ag nucleation and growth kinetic calculation data, parameters such as deposition temperature and time are controlled through regulation of the energy and flux of Ag deposition ions to prepare a discontinuous Ag layer organized by nano-scale island-shaped Ag particles. For example, referring to FIG. 1A, it shows the simulation calculation of the change in the free energy of Ag in the process of the vapor deposition, and FIG. 1B shows a typical process (two-dimensional section) of an island-shaped soft metal Ag seed layer growth.

A MeCN hard phase layer and a metallic Ag soft phase layer are alternately deposited using island-shaped Ag as the seed layer, the orientated growth of the subsequent alternately deposited coatings is induced and defined as a multi-arch structure by using the curve surface of island-shaped Ag surface as a template combined with the deposition parameters of the coating, so as to realize the controllable preparation of the nano composite coating having a shell-simulated multi-arch structure.

Accordingly, another aspect of the embodiment of the present application also provides a method for inducing preparation of a nano composite coating having a shell-simulated multi-arch structure based on a metal seed layer, comprising:

forming a discontinuous metal seed layer on the surface of a substrate, the discontinuous metal seed layer comprising a plurality of metal island-shaped seeds discretely distributed on the surface of the substrate; and with the surfaces of various metal island-shaped seeds in the discontinuous metal seed layer as growth templates, alternately depositing one or more arched hard nano ceramic phase layers and one or more arched soft metal phase layers on the various metal island-shaped seeds, performing orientated growth to form arched structure units, furthermore, mutually connecting the plurality of arched structure units, thereby forming a continuous multi-arch structure layer on the discontinuous metal seed layer.

In some embodiments, the method comprises: the discontinuous metal seed layers and the multi-arch structure layers are deposited on the substrate by using the physical vapor deposition technology, thereby obtaining the nano composite coating.

In some embodiments, the method comprises:

Step 1, depositing the discontinuous metal seed layer on the substrate subjected to pretreatment and ion etching using the soft metal target material, wherein the adopted working gas is a high-pure inert gas;

Step 2, alternately depositing hard nano ceramic phase layers and the soft metal phase layers on the substrate using the multi-element metal target material and the soft metal target material, thereby forming the multi-arch structure layer, wherein the adopted working gas comprises a high-pure inert gas, high-pure nitrogen and a hydrocarbon gas.

Further, the process conditions adopted by the physical vapor deposition technology comprise: the target current of a multi-element metal target material is 55 A-80 A, the target current of a soft target material is 25 A-40 A, the bias voltage is −20V to −100V, the temperature is 350° C.-450° C., the working distance is 35-50 cm, wherein the adopted working gas comprises argon, nitrogen and a hydrocarbon gas.

Further, the method comprises: the process conditions for depositing the multi-arch structure layer comprise: the flow of the high-pure inert gas is 200 sccm-400 sccm, the flow of the high-pure nitrogen is 300 sccm-800 sccm, the flow of the hydrocarbon gas is 10 sccm-100 sccm, and the rotation speed of a rotary plate is 1 rpm-5 rpm, wherein the total deposition time can be 60 min-150 min.

Further, the process conditions adopted in Step 1 comprise: the flow of the high-pure inert gas is 200 sccm-400 sccm, the target current of a soft target material is 25 A-40 A, the bias voltage is −20V to −100V, the temperature is 350° C.-450° C., the working distance is 35-50 cm, and the deposition time is 45 s-75 s.

Further, the process conditions in Step 2 comprise: the multi-element metal target material and the soft metal target material alternately work, the target current of the multi-element metal target material is 55 A-80 A, the target current of the soft metal target material is 25 A-40 A, the bias voltage is −20V to −100V, the temperature is 350° C.-450° C., the working distance is 35-50 cm, and the rotation speed of the rotary disc is 1 rpm-5 rpm; wherein, when the soft metal target material works, the flow of the high-pure inert gas is 200 sccm-400 sccm, and when the multi-element target metal material works, the flow of the high-pure inert gas is 200 sccm-400 sccm, the flow of the high-pure nitrogen is 300 sccm-800 sccm, the flow of the hydrocarbon gas is 10 sccm-100 sccm. Wherein, the alternating working time of the multi-element metal target material and the soft metal target material can be determined according to actual demand, for example the multi-element metal target material stops working when the hard nano ceramic phase layer reaches a required thickness (such as 5-20 nm), and the soft metal target material is used until the soft metal phase layer reaches the required thickness (such as 5-20 nm), then the soft metal target material stops working and the multi-element target metal material is used, such the alternation is repeated.

Further, the method further comprises:

the pretreated substrate, the multi-element metal target material and the soft metal target material are placed into the cavity of a vacuum plating equipment, and the vacuum degree in the cavity is $(3-6) \times 10^{-5}$ mbar, and meanwhile the cavity is heated, the heating temperature is 350-450° C., and the high-pure inert gas is the working gas;

the pretreated substrate is etched, and the multi-element metal target material and the soft metal target material are subjected to sputter cleaning, and then the Step 1 and Step 2 are performed.

Further, the method further comprises: the Step 1 and Step 2 are repeated.

Further, the method further comprises: in the Step 1, one or more of shapes, diameters, heights and mutual distances of various metal island-shaped seeds in the discontinuous metal seed layer are regulated by at least regulating one or more of deposition parameters (including target current, bias voltage, temperature, working distance, rotation speed of rotary disc, high-pure inert gas flow, etc.) of the soft metal target material.

Further, the method further comprises: in the Step 2, one or more of shapes, layers, thicknesses and soft metal atom contents of the hard nano ceramic phase layer and the metal soft phase layer in the multi-arch structure layer are regulated by at least regulating one or more of deposition parameters (including target current, bias voltage, temperature, working distance, rotation speed of a rotary disc, various working gas flows, etc.) and alternating period of the multi-element target metal material and the soft metal target material.

Further, the method comprises: the surface of the substrate is cleaned up until the surface of the substrate is clean and has a roughness Ra of 2.5 μm-3.5 μm, so as to complete the pretreatment of the substrate.

For example, the surface of the substrate is cleaned up or blasted, wherein the surface cleaning is that the surface of the substrate is polished with abrasive paper to remove the greasy dirt, impurities and rusts on the surface and finally ensure that the roughness of the surface of the substrate reaches 2.5 μm-3.5 μm, and then the surface of the substrate is washed for more than twice under the condition of ultrasound using acetone, alcohol and the like until being completely washed off. The above operations can be implemented using manners known in the art.

Further, the method further comprises: when the multi-element metal target material and the soft metal target material are subjected to sputter cleaning, the cavity is obstructed with a baffle for protection, and the high-pure inert gas is used as the working gas. Wherein, the time for sputter cleaning of the target material can be determined according to actual demand, for example 5 min, or longer, or shorter. The above operations can be implemented using manners known in the art.

Further, the method further comprises: when the pretreated substrate is subjected to ion etching, the bias voltage of 900 V-1200V (for example, the bias voltages of 900 V, 1100 V and 1200V are respectively used in turn) is used, and the high-pure inert gas is used as the working gas. Wherein, the time for ion etching of the substrate can be determined according to actual demand, for example 5 min, or longer, or shorter each time. The above operations can be implemented using manners known in the art.

Further, the method further comprises: after the nano composite coating is formed, the temperature in the cavity of the vacuum plating equipment is reduced to 300° C. or less, subsequently, the high-pure inert gas is introduced to cool the cavity to 100° C. or less, and then the substrate having the nano composite coating is taken out.

In some embodiments, the preparation solution specifically comprises:

(1) pretreating the surface of a substrate to be plated;

(2) placing the pretreated substrate into the cavity of the vacuum plating equipment and vacuumizing to a vacuum degree of $(3-6) \times 10^{-5}$ mbar, and meanwhile heating, wherein the heating temperature is 350-450° C., and high-pure Ar is the working gas;

(3) sputtering the target material and etching the substrate: sputtering and washing the target material for 5 min, and then performing ion etching on the substrate for 15 min;

(4) preparing a discontinuous metal seed layer: a soft metal target material (purity 99.9 at. %) is used, the gas uses high-pure argon, the deposition parameters of the soft metal target material are set on a progress control panel to construct an island-shaped discontinuous metal seed layer;

(5) preparing a multi-arch soft and hard alternating layer: a multi-element metal target material (purity 99.9 at. %) and a soft metal target material (purity 99.9 at. %) are used, the deposition parameters and alternate rhythm of the target are set in the program control panel respectively, the gas involves the selective introduction of high-purity nitrogen, a hydrocarbon gas and high-purity argon. In this step, the deposition parameters control of the target material and the selective introduction of gases should be arranged reasonably, so as not to affect the final formation of the shell-simulated multi-arch composite coating.

Further, if it is desired to extend and grow the shell-simulated multi-arch structure, steps (4)-(5) can be repeated.

In the above embodiments of the present application, the purities of the used multi-element metal target material, the soft metal target material and the like are all above 99.9 at. %.

In the above embodiments of the present application, the used hydrocarbon gases include but are not limited to methane, acetylene, propane and the like, preferably acetylene.

In the above embodiments of the present application, the purities of the used high-pure nitrogen, hydrocarbon gases and high-pure argon are at least above analytically pure.

Another aspect of the embodiment of the present application also provides use of the nano composite coating having a shell-simulated multi-arch structure, for example uses in the fields such as new energy, large aircraft, new aerospace vehicles, advanced manufacturing, high-speed rail transit, ocean engineering, nuclear power facilities, surface protection of medical devices, microelectronics/optoelectronic devices, especially uses in the protection field of key motion parts under aeroengine high temperature environment and marine environment.

The application forms can be: the nano composite coating having a shell-simulated multi-arch structure is deposited on key parts of new energy, large aircraft, new aerospace vehicles, advanced manufacturing, high-speed rail transit, ocean engineering, nuclear power facilities, microelectronics/optoelectronic devices and the like in the fields that have significant demands, but are not limited thereto.

Accordingly, the embodiment of the present application provides an equipment, comprising a substrate and the nano composite coating having a shell-simulated multi-arch structure which at least covers the local surface of the substrate. The equipment can be the above key part or sets of equipment containing these parts, and is not limited thereto.

For making those skilled in the art better understand the technical solution of the present application, the technical solution in the embodiments of the present application will be clearly and completely described in combination with the drawings of the embodiment of the present application below, the described embodiments are only parts of embodiments of the present application but not all the embodiments. Based on the embodiments of the present application, all other embodiments obtained by persons of ordinary skill in the art should be included within the protective scope of the present application without creative efforts.

Unless otherwise stated, various equipment, target materials and other raw materials used in the following examples can be purchased in the market or other ways, wherein the used sample characterization and performance test methods can be implemented in manners known in the art. For example, in the following examples, the friction coefficient is measured by UNIT-3 friction and abrasion tester (Bruker CETR, USA) in ball-plate configuration. The friction pair is a SiC ceramic ball with a diameter of 6 mm. The force loading mode is 5 N-2 Hz-60 min, and the abrasion track length is 5 mm. The abrasion loss rate (K) is calculated by abrasion loss in formula K=V/(FD), where V is the total abrasion loss, F is the normal load and D is the total sliding distance. The specific strength and specific tenacity are further calculated by measuring the compressive breaking strength and breaking tenacity, wherein the compressive breaking strength of the coating is calculated according to Hertz theory ($\sigma=P/\pi a^2$), the breaking tenacity of the coating is evaluated by measuring the indentation on the coating surface produced by Vickers indenter under the same load of 300 g.

Example 1: A method for inducing construction of a nano composite coating having a shell-simulated multi-arch structure based on a metal seed layer by adopting a physical vapor deposition technology, mainly comprising the following steps:
(1) the surface of a titanium alloy sample to be plated was subjected to mechanical polishing treatment to remove grease dirt, impurities and rusts on the surface, and the surface roughness Ra was finally ensured to be 2.5 μm-3.5 μm; and then the surface was subjected to ultrasonic cleaning twice with acetone and alcohol for 15 min each time.
(2) The cleaned sample was put into the cavity of vacuum plating equipment, and the cavity was vacuumized to a vacuum degree of $4\times10^{-5}$ mbar and meanwhile heated at 450° C.
(3) Target material sputtering and sample etching. During the stage of cleaning the target material, the baffle was used to obstruct the cavity for protection, and the cleaning time was 2-5 min. The sample was subjected to ion etching for three times using bias voltages of 900V, 1100V and 1200V successively, 5 min per etching. Argon was used as the working gas when the parts and target materials were cleaned.
(4) The metal island-shaped discontinuous Ag seed layer was prepared. The pure Ag target (purity 99.9 at. %) was used. The gas adopts high-pure argon. The deposition parameters of the metal Ag target material were set on the program control panel, including the pure Ag target current of 30 A, the bias voltage of −20 v, the argon flow of 200 sccm, the temperature of 350° C., working distance of 35 cm and the deposition time of 45 s, to construct the island-shaped discontinuous metal seed layer.
(5) The multi-arch soft-Ag hard-TiSiCN alternating layer was prepared. The TiSi target (purity 99.9 at. %) and Ag target (purity 99.9 at. %) were used, the deposition parameters and alternating rhythms of the Ag target and the TiSi target were set on the program control panel, and the gas involved selective introduction of high-pure nitrogen, a hydrocarbon gas and high-pure argon. The relevant parameters were as follows: the current of Ag target was 30 A, the current of the TiSi target was 65 A, the bias voltage was −20 v, the temperature was 350° C., the working distance was 35 cm, the flow of nitrogen was 450 sccm, the flow of acetylene was 80 sccm, the flow of argon was 200 sccm, the rotation speed of the rotary disc was 2 rpm, the alternating working time of the TiSi target and the Ag target was 30 s, and the total deposition time was 30 min.
(6) After the nano composite coating having a shell-simulated multi-arch structure was formed, the temperature of the cavity of the plating equipment was reduced to 300° C. or less, and then argon was introduced to cool the cavity to 100° C. or less and then the composite coating was taken out.

In this example, to increase the thickness of the nano composite coating having a shell-simulated multi-arch structure, steps (4) and (5) were repeated, and the total deposition time was controlled to 60 min.

Figure 2:
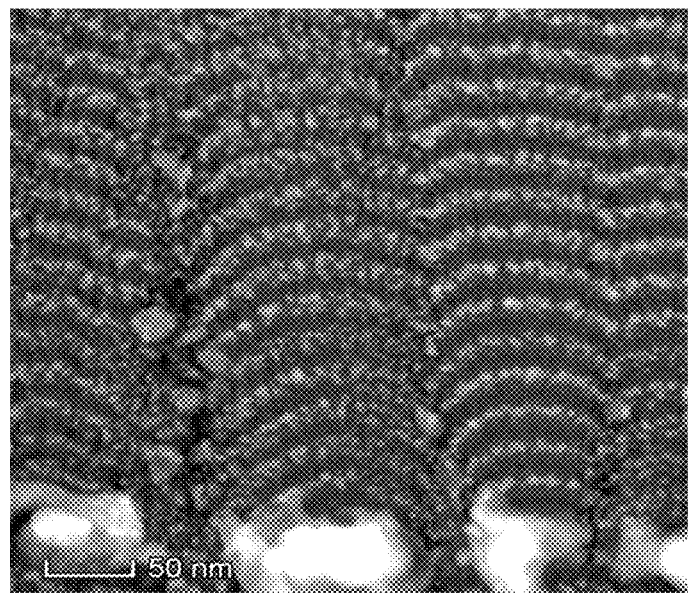
FIG. 2 is a STEM image of multi-arch structure TiSiCN—Ag nano composite coating of a shell-simulated nacre layer in example 1.

The STEM image of the nano composite coating having a shell-simulated multi-arch structure prepared in example 1 is as shown in FIG. 2, showing that the thickness is about 3 μm, and the outermost layer is the hard TiSiCN layer. By characterization, this coating has the breaking strength of 15 Gpa, the breaking tenacity of 2 MPa·m$^{1/2}$, the hardness of 37 GPa, the friction coefficient of 0.2 m and the abrasion rate in seawater of $0.6\times10^{-6}$ mm$^3$/(N·m).

Example 2: A method for inducing construction of a nano composite coating having a shell-simulated multi-arch structure based on a metal seed layer by using a physical vapor deposition technology, mainly comprising the following steps:
(1) the surface of a titanium alloy sample to be plated was subjected to mechanical polishing treatment to remove grease dirt, impurities and rusts on the surface, and the surface roughness Ra was finally ensured to be 2.5

μm-3.5 μm; and then the surface was subjected to ultrasonic cleaning twice with acetone and alcohol for 15 min each time.

(2) The cleaned sample was put into the cavity of vacuum plating equipment, the cavity was vacuumized to a vacuum degree of $4\times10^{-5}$ mbar and meanwhile heated at 400° C.

(3) Target material sputtering and sample etching. During the stage of cleaning the target material, the baffle was used to obstruct the cavity for protection, and the cleaning time was 2-5 min. The sample was subjected to ion etching for three times using bias voltages of 900V, 1100V and 1200V successively, 5 min per etching. Argon was used as the working gas when the parts and target materials were cleaned.

(4) The metal island-shaped discontinuous Ag seed layer was prepared. The pure Ag target (purity 99.9 at. %) was used. The gas adopts high-pure argon. The deposition parameters of the metal Ag target material were set on the program control panel, including the pure Ag target current of 30 A, the bias voltage of −40 v, the argon flow of 200 sccm, the temperature of 450° C., the working distance of 50 cm and the deposition time of 55 s, to construct the island-shaped discontinuous metal seed layer.

(5) The multi-arch soft-Ag hard-TiAlCN alternating layer was prepared. The TiAl target (purity 99.9 at. %) and Ag target (purity 99.9 at. %) were used, the deposition parameters and alternating rhythms of the Ag target and TiAl target were set on the program control panel, and the gas involved selective introduction of high-pure nitrogen, a hydrocarbon gas and high-pure argon. The relevant parameters were as follows: the target current of Ag was 30 A, TiAl target current was 60 A, the bias voltage was −40V, the temperature was 450° C., the working distance was 50 cm, the flow of nitrogen was 300 sccm, the flow of acetylene was 60 sccm, the flow of argon was 250 sccm, the rotation speed of the rotary disc was 2 rpm, the alternating working time of TiAl target and Ag target was 20 s, and the total deposition time was 10 min.

(6) After the nano composite coating having a shell-simulated multi-arch structure was formed, the temperature of the cavity of the plating equipment was reduced to 300° C. or less, and then argon was introduced to cool the cavity to 100° C. or less, and then the composite coating was taken out.

In this example, to increase the thickness of the nano composite coating having a shell-simulated multi-arch structure, steps (4) and (5) were repeated, and the total deposition time was controlled to 80 min.

Figure 3:
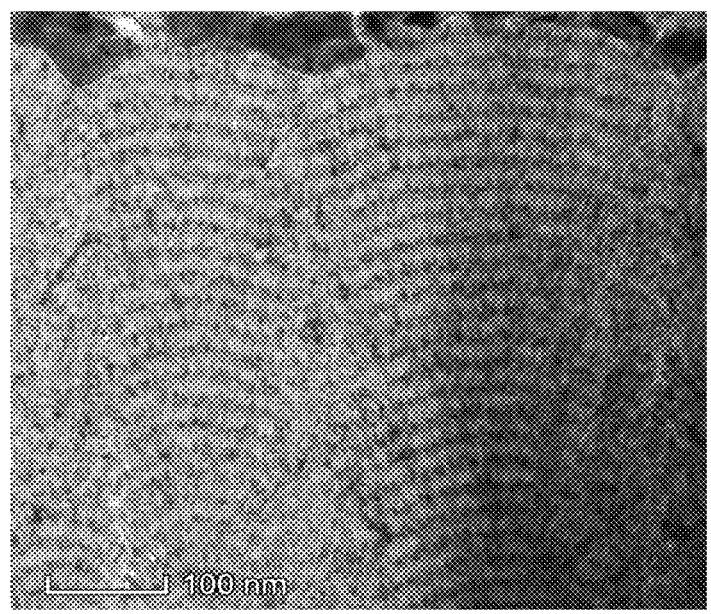
FIG. 3 is a STEM image of a multi-arch structure TiSiCN—Ag nano composite coating of a shell-simulated nacre layer in example 2.

The STEM image of the nano composite coating having a shell-simulated multi-arch structure prepared in example 2 is as shown in FIG. 3, showing that the thickness is about 5 μm, and the outermost layer is the hard TiAlCN layer. By characterization, this coating has the breaking strength of 13 Gpa, the breaking tenacity of 2.4 MPa·m$^{1/2}$, the hardness of 35 GPa, the friction coefficient of 0.23 m and the abrasion rate in seawater of $0.8\times10^{-6}$ mm$^3$/(N·m).

Example 3: A method for inducing construction of a nano composite coating having a shell-simulated multi-arch structure based on a metal seed layer by using a physical vapor deposition technology, mainly comprising the following steps:

(1) the surface of a titanium alloy sample to be plated was subjected to mechanical polishing treatment to remove grease dirt, impurities and rusts on the surface, and the surface roughness Ra was finally ensured to be 2.5 μm-3.5 μm; and then the surface was subjected to ultrasonic cleaning twice with acetone and alcohol for 15 min each time.

(2) The cleaned sample was put into the cavity of vacuum plating equipment, the cavity was vacuumized to a vacuum degree of $4\times10^{-5}$ mbar and meanwhile heated at 350° C.

(3) Target material sputtering and sample etching. During the stage of cleaning the target material, the baffle was used to obstruct the cavity for protection, and the cleaning time was 2-5 min. The sample was subjected to ion etching for three times using bias voltages of 900V, 1100V and 1200V successively, 5 min per etching. Argon was used as the working gas when the parts and target materials were cleaned.

(4) The metal island-shaped discontinuous Al seed layer was prepared. The pure Al target (purity 99.9 at. %) was used. The gas adopts high-pure argon. The deposition parameters of the metal Al target material were set on the program control panel, including the pure Al target current of 35 A, the bias voltage of −60 v, the argon flow of 300 sccm, the temperature of 400° C., the working distance of 45 cm and the deposition time of 75 s, to construct the island-shaped discontinuous metal seed layer.

(5) The multi-arch soft-Al hard-TiSiCN alternating layer was prepared. The TiSi target (purity 99.9 at. %) and Al target (purity 99.9 at. %) were used, the deposition parameters and alternating rhythms of the Al target and TiSi target were set on the program control panel, and the gas involved selective introduction of high-pure nitrogen, a hydrocarbon gas and high-pure argon. The relevant parameters were as follows: the target current of Al was 35 A, the current of TiSi target was 70 A, the bias voltage was −60V, the temperature was 400° C., the working distance was 40 cm, the flow of nitrogen was 500 sccm, the flow of acetylene was 100 sccm, the flow of argon was 300 sccm, the rotation speed of the rotary disc was 3 rpm, the alternating working time of TiSi target and Al target was 30 s, and the total deposition time was 20 min.

(6) After the nano composite coating having a shell-simulated multi-arch structure was formed, the temperature of the cavity of the plating equipment was reduced to 300° C. or less, and then argon was introduced to cool the cavity to 100° C. or less, and then the composite coating was taken out.

In this example, to increase the thickness of the nano composite coating having a shell-simulated multi-arch structure, steps (4) and (5) were repeated, and the total deposition time was controlled to 100 min.

Example 4: A method for inducing construction of a nano composite coating having a shell-simulated multi-arch structure based on a metal seed layer by using a physical vapor deposition technology, mainly comprising the following steps:

(1) the surface of a titanium alloy sample to be plated was subjected to mechanical polishing treatment to remove grease dirt, impurities and rusts on the surface, and the surface roughness Ra was finally ensured to be 2.5 μm-3.5 μm; and then the surface was subjected to ultrasonic cleaning twice with acetone and alcohol for 15 min each time.

(2) The cleaned sample was put into the cavity of a vacuum plating equipment, the cavity was vacuumized to a vacuum degree of $4\times10^{-5}$ mbar and meanwhile heated at 450° C.

(3) Target material sputtering and sample etching. During the stage of cleaning the target material, the baffle was used to obstruct the cavity for protection, and the cleaning time was 2-5 min. The sample was subjected to ion etching for three times using bias voltages of 900V, 1100V and 1200V successively, 5 min per etching. Argon was used as the working gas when the parts and target materials were cleaned.

(4) The metal island-shaped discontinuous Cu seed layer was prepared. The pure Cu target (purity 99.9 at. %) was used. The gas adopts high-pure argon. The deposition parameters of the metal Cu target were set on the program control panel, including the pure Cu target current of 40 A, the bias voltage of −100V, the argon flow of 350 sccm, the working distance of 35 cm and the deposition time of 60 s, to construct the island-shaped discontinuous metal seed layer.

(5) The multi-arch soft-Cu hard-TiSiCN alternating layer was prepared. The TiSi multi-element metal target (purity 99.9 at. %) and Cu soft metal target (purity 99.9 at. %) were used, the deposition parameters and alternating rhythms of the Cu target and TiSi target were set on the program control panel, and the gas involved selective introduction of high-pure nitrogen, a hydrocarbon gas and high-pure argon. The relevant parameters were as follows: the current of Cu target was 40 A, the current of TiSi target was 60 A, the bias voltage was −100V, the temperature was 450° C., the working distance was 50 cm, the flow of nitrogen was 600 sccm, the flow of acetylene was 40 sccm, the flow of argon was 350 sccm, the rotation speed of the rotary disc was 3 rpm, the alternating working time of TiSi target and Cu target was 20 s, and the total deposition time was 15 min.

(6) After the nano composite coating having a shell-simulated multi-arch structure was formed, the temperature of the cavity of the plating equipment was reduced to 300° C. or less, and then argon was introduced to cool the cavity to 100° C. or less and then the composite coating was taken out.

In this example, to increase the thickness of the nano composite coating having a shell-simulated multi-arch structure, steps (4) and (5) were repeated, and the total deposition time was controlled to 120 min.

Example 5: this example is the basically same as example 1, and the differences are as follows:

In step (4), the current of the adopted pure Ag target was 25 A, the flow of argon was 400 sccm, and the rest parameters were the same as those in example 1.

In step (5), the adopted deposition parameters were as follows: the current of Ag target was 25 A, the current of TiSi target was 55 A, the bias voltage was −80V, the flow of nitrogen was 300 sccm, the flow of methane was 10 sccm, the flow of argon was 200 sccm, the rotation speed of the rotary disc was 5 rpm, and the rest parameters were the same as those in example 1.

Example 6: this example is the basically same as example 1, and the differences are as follows:

In step (5), the adopted deposition parameters were as follows: the current of Ag target was 40 A, the current of TiSi target was 80 A, the bias voltage was −100V, the flow of nitrogen was 800 sccm, the flow of propane was 100 sccm, the flow of argon was 400 sccm, the rotation speed of the rotary disc was 1 rpm, and the rest parameters were the same as those in example 1.

Comparative example 1: a coating 1 (TiSiCN—Ag microscopic multi-layer structure) was prepared by using a physical vapour deposition technology, which mainly comprised the following steps:

(1) the surface of a titanium alloy sample to be plated was subjected to mechanical polishing treatment to remove grease dirt, impurities and rusts on the surface, and the surface roughness Ra was finally ensured to be 2.5 μm-3.5 μm; and then the surface was subjected to ultrasonic cleaning twice with acetone and alcohol for 15 min each time.

(2) The cleaned sample was put into the cavity of a vacuum plating equipment, the cavity was vacuumized to a vacuum degree of $4\times10^{-5}$ mbar and meanwhile heated at 450° C.

(3) Target material sputtering and sample etching. During the stage of cleaning the target material, the baffle was used to obstruct the cavity for protection, and the cleaning time was 2-5 min. The sample was subjected to ion etching for three times using bias voltages of 900V, 1100V and 1200V successively, 5 min per etching. Argon was used as the working gas when the parts and target materials were cleaned.

(4) The TiSiCN layer was prepared. Binary TiSi target was used. The gas adopted high-pure argon and acetylene gas. The current of TiSi target was 70 A, the current of nitrogen was 200 sccm, and the flow of acetylene gas was 80 sccm.

(5) The Ag layer was prepared. The pure metal Ag target (purity 99.9 at. %) was used. The current of Ag target was 30 A, the flow of argon was 450 sccm, the total deposition time was 60 min, the rotation speed of the rotary disc was 2 rpm. A thickness ratio of TiSiCN layer to Ag layer was 10:1, the thickness of Ag layer was 20 nm, cycle period was 6, the outermost layer was deposited with TiSiCN layer alone whose thickness was 100 nm. After deposition was completed, the temperature of the cavity of the coating equipment was reduced to 300° C. or less, subsequently, argon was introduced to cool the cavity to 100° C. or less, and then the sample was taken out to obtain the coating 1.

Comparative example 2: a coating 2 (TiSiCN—Ag nano multi-layer structure) was prepared by using a physical vapour deposition technology, which mainly comprised the following steps:

(1) the surface of a titanium alloy sample to be plated was subjected to mechanical polishing treatment to remove grease dirt, impurities and rusts on the surface, and the surface roughness Ra was finally ensured to be 2.5 μm-3.5 μm; and then the surface was subjected to ultrasonic cleaning twice with acetone and alcohol for 15 min each time.

(2) The cleaned sample was put into the cavity of a vacuum plating equipment, the cavity was vacuumized to a vacuum degree of $4\times10^{-5}$ mbar and meanwhile heated at 450° C.

(3) Target material sputtering and sample etching. During the stage of cleaning the target material, the baffle was used to obstruct the cavity for protection, and the cleaning time was 2-5 min. The sample was subjected to ion etching for three times using bias voltages of 900V, 1100V and 1200V successively, 5 min per etching. Argon was used as the working gas when the parts and target materials were cleaned.

(4) The TiSiCN layer was prepared. Binary TiSi target was used. The gas adopted high-pure argon and acetylene gas. The current of TiSi target was 70 A, the current of nitrogen was 200 sccm, and the flow of acetylene gas was 80 sccm.

(5) The Ag layer was prepared. The pure metal Ag target (purity 99.9 at. %) was used. The current of Ag target was 30 A, the flow of argon was 450 sccm, the total deposition time was 60 min, the rotation speed of the rotary disc was 2 rpm. A thickness ratio of TiSiCN layer to Ag layer was 1:1, the thickness of Ag layer was 5 nm, cycle period was 150. After deposition was completed, the temperature of the cavity of the coating equipment was reduced to 300° C. or less, subsequently, argon was introduced to cool the cavity to 100° C. or less, and then the sample was taken out to obtain the coating 2.

Comparative example 3: a coating 3 (TiSiCN coating) was prepared by using a physical vapour deposition technology, which mainly comprised the following steps:

(1) the surface of a titanium alloy sample to be plated was subjected to mechanical polishing treatment to remove grease dirt, impurities and rusts on the surface, and the surface roughness Ra was finally ensured to be 2.5 μm-3.5 μm; and then the surface was subjected to ultrasonic cleaning twice with acetone and alcohol for 15 min each time.

(2) The cleaned sample was put into the cavity of a vacuum plating equipment, the cavity was vacuumized to a vacuum degree of $4 \times 10^{-5}$ mbar and meanwhile heated at 450° C.

(3) Target material sputtering and sample etching. During the stage of cleaning the target material, the baffle was used to obstruct the cavity for protection, and the cleaning time was 2-5 min. The sample was subjected to ion etching for three times using bias voltages of 900V, 1100V and 1200V successively, 5 min per etching. Argon was used as the working gas when the parts and target materials were cleaned.

(4) The TiSiCN layer was prepared. Binary TiSi target was used. The gas adopted high-pure argon and acetylene gas. The current of TiSi target was 70 A, the current of nitrogen was 200 sccm, and the flow of acetylene gas was 80 sccm, the total deposition time was 60 min, and the rotation speed of the rotary disc was 2 rpm. After deposition was completed, the temperature of the cavity of the coating equipment was reduced to 300° C. or less, subsequently, argon was introduced to cool the cavity to 100° C. or less, and then the sample was taken out to obtain the coating 3.

Comparative example 4: a nano composite coating having a shell-simulated stacking type nacre layer was prepared by using a multi-arch ion plating technology, which mainly comprised the following steps:

(1) the surface of a titanium alloy sample to be plated was subjected to mechanical polishing treatment and then subjected to ultrasonic cleaning twice with acetone and alcohol for 15 min each time.

(2) The cleaned sample was put into the cavity, the cavity was vacuumized to a vacuum degree of $4 \times 10^{-5}$ mbar and meanwhile heated at 450° C.

(3) Target material sputtering and sample etching. The target material was sputtered for 5 min, the titanium alloy sample was subjected to ion etching for 15 min, and the bias voltage adopted by the etching was 1200V.

(4) The deposited shell-simulated nano TiSiCN—Ag composite coating was prepared. The TiSi target and Ag target (purity 99.9 at. %) were used. The gas adopted high-pure nitrogen and acetylene gas, the flow of argon was 200 sccm, the flow of nitrogen was 300 sccm, the flow of acetylene was 10 sccm, the current of TiSi target was 60 A, the current of Ag target was 35 A, the deposition bias voltage was −20V, the total deposition time was 60 min, and the rotation speed of the rotary disc was 2 rpm. The coating finally obtained in this comparative example has the breaking strength of 8 GPa, the breaking tenacity of 2.4 MPa·m$^{1/2}$, the hardness of 30 GPa, the friction coefficient of 0.21 and the abrasion rate in seawater of $0.9 \times 10^{-6}$ mm$^3$/(N·m).

Figure 4A:
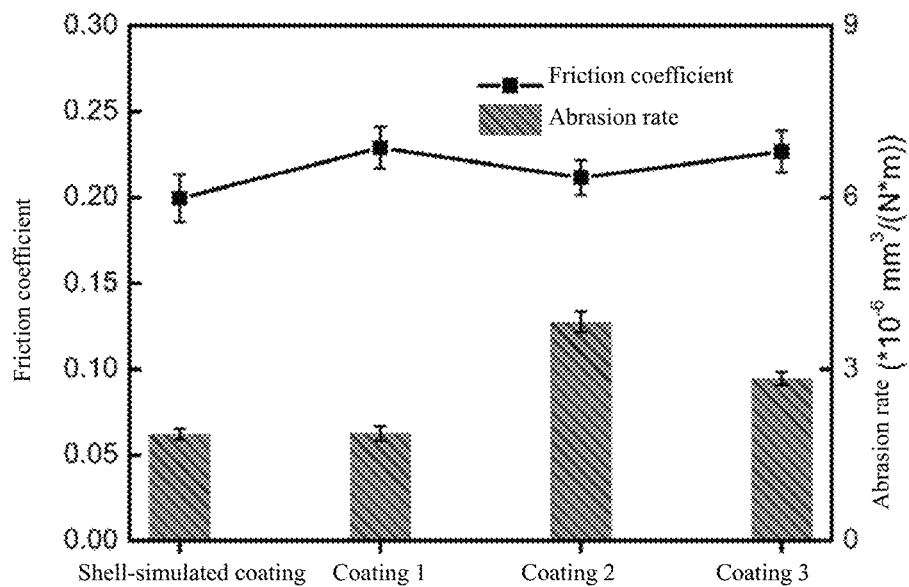
FIGS. 4A-4B are comparison diagrams of friction performances of obtained nano composite coating having a shell-simulated multi-arch structure in example 1 of the present application and other three coatings.
Figure 4B:
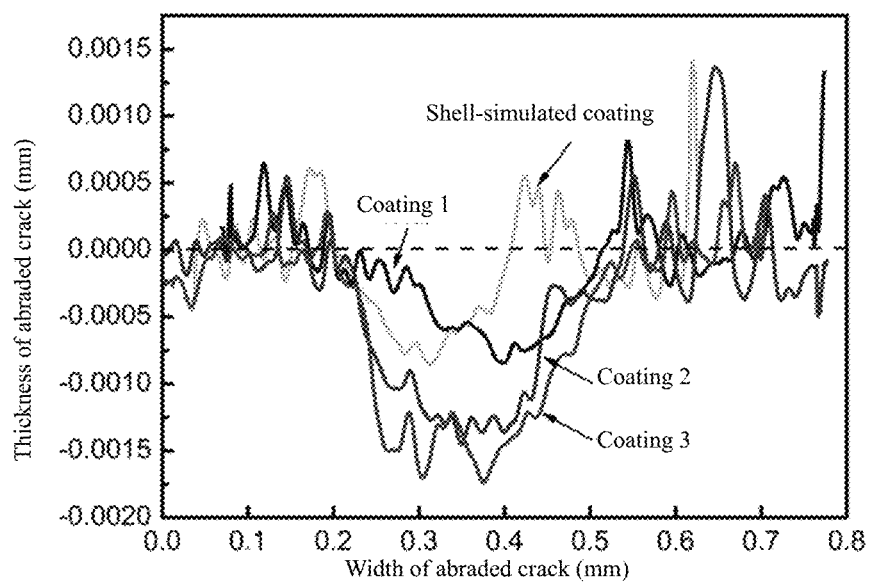
Figure 5:
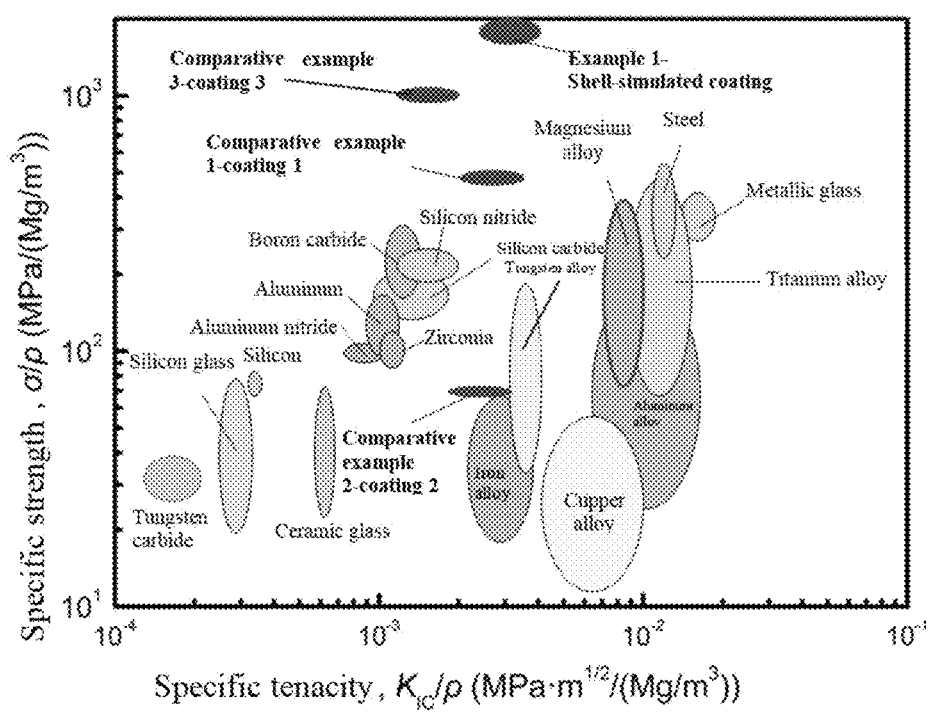
FIG. 5 is a comparison diagram of specific strengths and specific tenacities of the nano composite coating having a shell-simulated multi-arch structures obtained in examples 1 and 2 of the present application and other materials.

FIGS. 4A and 4B respectively show test results such as friction coefficients and abrasion rates of the coating obtained in example 1 (defined as "shell-simulated coating"), the coating 1 (TiSiCN—Ag microcosmic multilayer structure in comparative example 1), the coating 2 (TiSiCN—Ag nano multilayer structure in comparative example 2) and the coating 3 (TiSiCN coating in comparative example 3). FIG. 5 shows test results such as specific strengths and specific tenacities of the coating obtained in example 1, the coating 1, the coating 2 and the coating 3.

For those skilled in the art, it is obvious that the present application is not limited to the details of the above exemplary examples, and can be realized in other specific forms without departing from the spirit or basic features of the present application. Therefore, no matter from which point of view, examples should be regarded as be exemplary but not limiting. The scope of the present application is limited by the attached claims rather than the above description. Therefore, it is intended to include all changes within the meaning and scope of the equivalent elements of the claims in the present application. Any reference numbers in the claims shall not be regarded as limiting the involved claims.

In addition, it should be understood that although the specification is described according to the embodiments, not every embodiment only contains an independent technical solution. This description manner of the specification is only for the sake of clarity. Those skilled in the art should take the description as a whole, and the technical solutions in each embodiment can also be appropriately combined to form other embodiments that can be understood by those skilled in the art.

What is claimed is:

1. A nano composite coating having a shell-simulated multi-arch structure, comprising a discontinuous metal seed layer and a continuous multi-arch structure layer,
    wherein the discontinuous metal seed layer comprises a plurality of metal island-shaped seeds discretely distributed on a surface of a substrate;
    the continuous multi-arch structure layer comprises a plurality of arched structure units respectively deposited on the plurality of metal island-shaped seeds,
    wherein each of the plurality of arched structure units comprises one or more arched hard nano ceramic phase layers and one or more arched soft metal phase layers, and the one or more arched hard nano ceramic phase layers and the one or more arched soft metal phase layers are alternately deposited on the plurality of metal island-shaped seeds correspondingly.

2. The nano composite coating having the shell-simulated multi-arch structure according to claim 1, wherein
    each of the plurality of metal island-shaped seeds is of an ellipsoid shape and has a thickness of 20-40 nm and a diameter of 50-100 nm, and a distance between adjacent metal island-shaped seeds is 30-60 nm; and/or the plurality of arched structure units are successively connected in a direction parallel to the surface of the substrate; and/or both the one or more arched hard nano ceramic phase layers and the one or more arched soft metal phase layers in the plurality of arched structure units have a nano-scale thickness, and the nano-scale thicknesses is 5-20 nm; and/or an outermost layer of the nano composite coating is one of the one or more arched hard nano ceramic phase layers; and/or each of the plurality of arched structure units is formed via an orientated growth by using a corresponding metal island-shaped seed surface as a growth template.

3. The nano composite coating having the shell-simulated multi-arch structure according to claim 1, wherein a material of the discontinuous metal seed layer or a material of the one or more arched soft metal phase layers comprises metal Ag, Cu or Al; and/or a material of the one or more arched hard nano ceramic phase layers comprises MeCN, wherein Me comprises Ti, Si or Al.

4. The nano composite coating having the shell-simulated multi-arch structure according to claim 1, wherein the nano composite coating is of a red abalone shell-simulated nacreous layer aragonite structure, has a hardness of greater than or equal to 30 GPa, a breaking strength of greater than or equal to 15 GPa, and an abrasion rate in a seawater environment of $10^{-7}$ mm$^3$/Nm order of magnitudes; and a thickness of the nano composite coating is 2-5 μm.

5. A method for preparation of the nano composite coating having the shell-simulated multi-arch structure of claim 1, comprising:

forming a discontinuous metal seed layer on a surface of a substrate, wherein the discontinuous metal seed layer comprises a plurality of metal island-shaped seeds discretely distributed on the surface of the substrate; and using surfaces of the plurality of metal island-shaped seeds in the discontinuous metal seed layer as growth templates, alternately depositing one or more arched hard nano ceramic phase layers and one or more arched soft metal phase layers on the plurality of metal island-shaped seeds, performing an orientated growth to form a plurality of arched structure units, and mutually connecting the plurality of arched structure units, thereby forming a continuous multi-arch structure layer on the discontinuous metal seed layer.

6. The method according to claim 5, further comprising:

successively depositing the discontinuous metal seed layer and the continuous multi-arch structure layer on the substrate using a physical vapor deposition technology, thereby obtaining the nano composite coating;

wherein process conditions adopted by the physical vapor deposition technology comprise: a target current of a multi-element metal target material of 55 A-80 A, a target current of a soft metal target material of 25 A-40 A, a bias voltage of −20V to −100V, a temperature of 350° C.-450° C., a working distance of 35-50 cm, and a working gas comprising argon, nitrogen and a hydrocarbon gas.

7. The method according to claim 6, comprising the following steps:

step 1, depositing the discontinuous metal seed layer on the substrate subjected to a pretreatment and an ion etching by using the soft metal target material, wherein the substrate subjected to the pretreatment and the ion etching, the multi-element metal target material and the soft metal target material are placed into a cavity of a vacuum plating equipment, wherein a vacuum degree in the cavity of the vacuum plating equipment is $(3\text{-}6)\times10^{-5}$ mbar, and heated at a temperature of 350-450° C., and the working gas is a high-pure inert gas, wherein before step 1, the substrate subjected to the pretreatment is etched, and sputter cleaning is performed on the multi-element metal target material and the soft metal target material;

step 2, alternately depositing the one or more arched hard nano ceramic phase layers and the one or more arched soft metal phase layers on the substrate by using the multi-element metal target material and the soft metal target material, thereby forming the continuous multi-arch structure layer, wherein the working gas comprises a high-pure inert gas, high-pure nitrogen and the hydrocarbon gas;

wherein process conditions for depositing the continuous multi-arch structure layer comprise: a flow of the high-pure inert gas of 200 sccm-400 sccm, a flow of the high-pure nitrogen of 300 sccm-800 sccm, a flow of the hydrocarbon gas of 10 sccm-100 sccm, a rotation speed of a rotary plate of 1 rpm-5 rpm, and a total deposition time of 60 min-150 min; and repeating step 1 and step 2.

8. The method according to claim 7, further comprising:

cleaning up the surface of the substrate until the surface of the substrate is clean and has a roughness Ra of 2.5 μm-3.5 μm, and completing the pretreatment of the substrate; and/or when the multi-element metal target material and the soft metal target material are subjected to the sputter cleaning, using a baffle to obstruct a cavity for protection, and using the high-pure inert gas as the working gas; and/or when the substrate is subjected to the ion etching, using the bias voltage of 900 V-1200V, and using the high-pure inert gas as the working gas; and/or after the nano composite coating is formed, reducing the temperature in the cavity of the vacuum plating equipment to 300° C. or less, subsequently, introducing the high-pure inert gas to cool the cavity to 100° C. or less, and then taking out the substrate having the nano composite coating;

wherein the nano composite coating is the nano composite coating having the shell-simulated multi-arch structure, wherein the nano composite coating comprises the discontinuous metal seed layer and the continuous multi-arch structure layer, the discontinuous metal seed layer comprises the plurality of metal island-shaped seeds discretely distributed on the surface of the substrate; the continuous multi-arch structure layer comprises the plurality of arched structure units respectively deposited on the plurality of metal island-shaped seeds, each of the plurality of arched structure units comprises the one or more arched hard nano ceramic phase layers and the one or more arched soft metal phase layers, and the one or more arched hard nano ceramic phase layers and the one or more arched soft metal phase layers are alternately deposited on the plurality of metal island-shaped seeds correspondingly.

9. The method according to claim 7, wherein in step 1, one or more of shapes, diameters, heights and mutual distances of the plurality of metal island-shaped seeds in the discontinuous metal seed layer are regulated by at least regulating one or more of deposition parameters of a target material of the nano composite coating;

and/or, in step 2, one or more of shapes, layers, thicknesses and soft metal atom contents of the one or more arched hard nano ceramic phase layers and the one or more arched soft metal phase layers in the continuous multi-arch structure layer are regulated by at least regulating one or more of the deposition parameters and alternating period of the target material.

10. An equipment, comprising the substrate, further comprising the nano composite coating having the shell-simulated multi-arch structure according to claim 1, wherein the nano composite coating at least covers a surface of the substrate.

11. The method according to claim 8, wherein
each of the plurality of metal island-shaped seeds is of an ellipsoid shape and has a thickness of 20-40 nm and a diameter of 50-100 nm, and a distance between adjacent metal island-shaped seeds is 30-60 nm; and/or
the plurality of arched structure units are successively connected in a direction parallel to the surface of the substrate; and/or
both the one or more arched hard nano ceramic phase layers and the one or more arched soft metal phase layers in the plurality of arched structure units have a nano-scale thickness, and the nano-scale thicknesses is 5-20 nm; and/or
an outermost layer of the nano composite coating is one of the one or more arched hard nano ceramic phase layers; and/or
each of the plurality of arched structure units is formed via an orientated growth by using a corresponding metal island-shaped seed surface as a growth template.

12. The method according to claim 8, wherein
a material of the discontinuous metal seed layer or a material of the one or more arched soft metal phase layers comprises metal Ag, Cu or Al; and/or
a material of the one or more arched hard nano ceramic phase layers comprises MeCN, wherein Me comprises Ti, Si or Al.

13. The method according to claim 8, wherein the nano composite coating is of a red abalone shell-simulated nacreous layer aragonite structure, has a hardness of greater than or equal to 30 GPa, a breaking strength of greater than or equal to 15 GPa, and an abrasion rate in a seawater environment of $10^{-7}$ mm$^3$/Nm order of magnitudes; and a thickness of the nano composite coating is 2-5 μm.

14. The method according to claim 8, wherein
each of the plurality of metal island-shaped seeds is of an ellipsoid shape and has a thickness of 20-40 nm and a diameter of 50-100 nm, and a distance between adjacent metal island-shaped seeds is 30-60 nm; and/or
the plurality of arched structure units are successively connected in a direction parallel to the surface of the substrate; and/or
both the one or more arched hard nano ceramic phase layers and the one or more arched soft metal phase layers in the plurality of arched structure units have a nano-scale thickness, and the nano-scale thicknesses is 5-20 nm; and/or
an outermost layer of the nano composite coating is one of the one or more arched hard nano ceramic phase layers; and/or
each of the plurality of arched structure units is formed via an orientated growth by using a corresponding metal island-shaped seed surface as a growth template.

15. The method according to claim 8, wherein
a material of the discontinuous metal seed layer or a material of the one or more arched soft metal phase layers comprises metal Ag, Cu or Al; and/or
a material of the one or more arched hard nano ceramic phase layers comprises MeCN, wherein Me comprises Ti, Si or Al.

16. The method according to claim 8, wherein the nano composite coating is of a red abalone shell-simulated nacreous layer aragonite structure, has a hardness of greater than or equal to 30 GPa, a breaking strength of greater than or equal to 15 GPa, and an abrasion rate in a seawater environment of $10^{-7}$ mm$^3$/Nm order of magnitudes; and a thickness of the nano composite coating is 2-5 μm.

* * * * *